US008952534B2

(12) United States Patent
Lai et al.

(10) Patent No.: US 8,952,534 B2
(45) Date of Patent: *Feb. 10, 2015

(54) SEMICONDUCTOR DEVICE AND SEMICONDUCTOR ASSEMBLY WITH LEAD-FREE SOLDER

(71) Applicant: Taiwan Semiconductor Manufacturing Company, Ltd., Hsinchu (TW)

(72) Inventors: Yi-Jen Lai, Chang Hua (TW); Chih-Kang Han, Hsinchu (TW); Chien-Pin Chan, Pingzhen (TW); Chih-Yuan Chien, Zhubei (TW); Huai-Tei Yang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/083,521

(22) Filed: Nov. 19, 2013

(65) Prior Publication Data

US 2014/0070409 A1    Mar. 13, 2014

Related U.S. Application Data

(63) Continuation of application No. 12/702,636, filed on Feb. 9, 2010, now Pat. No. 8,610,270.

(51) Int. Cl.
*H01L 23/00*    (2006.01)
*H01L 25/065*    (2006.01)
*H01L 25/00*    (2006.01)
*H01L 21/683*    (2006.01)

(52) U.S. Cl.
CPC ............... *H01L 24/13* (2013.01); *H01L 24/16* (2013.01); *H01L 24/81* (2013.01); *H01L 24/94* (2013.01);

(Continued)

(58) Field of Classification Search
USPC .................. 257/737, 734, 738, 778, 779, 782
See application file for complete search history.

(56) References Cited

U.S. PATENT DOCUMENTS 3,528,090 A    9/1970    Van Laer
4,380,867 A    4/1983    Antson
(Continued)

FOREIGN PATENT DOCUMENTS

CN    1606155 A    4/2005
JP    1993335313    12/1993
JP    2000228420    8/2000

OTHER PUBLICATIONS

Chinese Office Action in Corresponding Application No. 201010213358.4.
(Continued)

*Primary Examiner* — Mamadou Diallo
(74) *Attorney, Agent, or Firm* — Lowe Hauptman & Ham, LLP

(57) ABSTRACT

A semiconductor device includes a semiconductor substrate, a pad region on the semiconductor substrate, a passivation layer over the semiconductor substrate and at least a portion of the pad region, and a bump structure overlying the pad region. The passivation layer has an opening defined therein to expose at least another portion of the pad region. The bump structure is electrically connected to the pad region via the opening. The bump structure includes a copper layer and a SnAg layer overlying the copper layer. The SnAg layer has a melting temperature higher than the eutectic temperature of Sn and Ag.

19 Claims, 6 Drawing Sheets

(52) U.S. Cl.
CPC ............ *H01L 24/97* (2013.01); *H01L 25/0657* (2013.01); *H01L 25/50* (2013.01); *H01L 24/11* (2013.01); *H01L 21/6836* (2013.01); *H01L 2221/6834* (2013.01); *H01L 2224/1308* (2013.01); *H01L 2224/13082* (2013.01); *H01L 2224/13083* (2013.01); *H01L 2224/13109* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/1357* (2013.01); *H01L 2224/136* (2013.01); *H01L 2224/16* (2013.01); *H01L 2224/81001* (2013.01); *H01L 2224/812* (2013.01); *H01L 2224/81815* (2013.01); *H01L 2224/97* (2013.01); *H01L 2225/06513* (2013.01); *H01L 2924/01012* (2013.01); *H01L 2924/01013* (2013.01); *H01L 2924/01022* (2013.01); *H01L 2924/01025* (2013.01); *H01L 2924/01029* (2013.01); *H01L 2924/0103* (2013.01); *H01L 2924/01032* (2013.01); *H01L 2924/01033* (2013.01); *H01L 2924/01038* (2013.01); *H01L 2924/01046* (2013.01); *H01L 2924/01047* (2013.01); *H01L 2924/01049* (2013.01); *H01L 2924/01051* (2013.01); *H01L 2924/01073* (2013.01); *H01L 2924/01078* (2013.01); *H01L 2924/01079* (2013.01); *H01L 2924/01082* (2013.01); *H01L 2924/01327* (2013.01); *H01L 2924/04941* (2013.01); *H01L 2924/19041* (2013.01); *H01L 2924/3011* (2013.01); *H01L 2924/00013* (2013.01); *H01L 2924/01005* (2013.01); *H01L 2924/01006* (2013.01); *H01L 2924/01019* (2013.01); *H01L 2924/01023* (2013.01); *H01L 2924/01024* (2013.01); *H01L 2924/0104* (2013.01); *H01L 2924/0105* (2013.01); *H01L 2924/01074* (2013.01); *H01L 2924/01075* (2013.01); *H01L 2924/01322* (2013.01); *H01L 2924/014* (2013.01)
USPC ........... 257/737; 257/734; 257/738; 257/778; 257/779

(56) References Cited

U.S. PATENT DOCUMENTS

| | | | |
|---|---|---|---|
| 4,720,740 | A | 1/1988 | Clements et al. |
| 5,134,460 | A | 7/1992 | Brady et al. |
| 5,448,114 | A | 9/1995 | Kondoh et al. |
| 5,747,881 | A | 5/1998 | Hosomi et al. |
| 6,191,493 | B1 | 2/2001 | Yasunaga et al. |
| 6,218,281 | B1 | 4/2001 | Watanabe et al. |
| 6,229,220 | B1 | 5/2001 | Saitoh et al. |
| 6,232,563 | B1 | 5/2001 | Kim et al. |
| 6,426,556 | B1 | 7/2002 | Lin |
| 6,464,895 | B2 | 10/2002 | Forat et al. |
| 6,492,198 | B2 | 12/2002 | Hwang |
| 6,576,381 | B1 | 6/2003 | Hirano et al. |
| 6,578,754 | B1 | 6/2003 | Tung |
| 6,590,295 | B1 | 7/2003 | Liao et al. |
| 6,592,019 | B2 | 7/2003 | Tung |
| 6,731,003 | B2 | 5/2004 | Joshi et al. |
| 6,770,958 | B2 | 8/2004 | Wang et al. |
| 6,818,545 | B2 | 11/2004 | Lee et al. |
| 6,828,677 | B2 | 12/2004 | Yap et al. |
| 6,853,076 | B2 | 2/2005 | Datta et al. |
| 6,869,831 | B2 | 3/2005 | Cowens et al. |
| 6,879,041 | B2 | 4/2005 | Yamamoto et al. |
| 6,917,119 | B2 | 7/2005 | Lee et al. |
| 6,958,539 | B2 | 10/2005 | Lay et al. |
| 7,008,867 | B2 | 3/2006 | Lei |
| 7,012,333 | B2 | 3/2006 | Shimoyama et al. |
| 7,064,436 | B2 | 6/2006 | Ishiguri et al. |
| 7,215,033 | B2 | 5/2007 | Lee et al. |
| 7,271,497 | B2 | 9/2007 | Joshi et al. |
| 7,348,210 | B2 | 3/2008 | Daubenspeck et al. |
| 7,391,112 | B2 | 6/2008 | Li et al. |
| 7,462,942 | B2 | 12/2008 | Tan et al. |
| 7,501,311 | B2 | 3/2009 | Tsai |
| 7,524,755 | B2 | 4/2009 | Widodo et al. |
| 7,566,650 | B2 | 7/2009 | Lin et al. |
| 7,592,246 | B2 | 9/2009 | Akram |
| 7,648,899 | B1 | 1/2010 | Banerji et al. |
| 7,825,511 | B2 | 11/2010 | Daubenspeck et al. |
| 2001/0000321 | A1 | 4/2001 | Takeda et al. |
| 2002/0014705 | A1 | 2/2002 | Ishio et al. |
| 2002/0033531 | A1 | 3/2002 | Matsushima et al. |
| 2003/0156969 | A1 | 8/2003 | Choi et al. |
| 2003/0216025 | A1 | 11/2003 | Lu et al. |
| 2004/0166661 | A1 | 8/2004 | Lei |
| 2005/0001324 | A1 | 1/2005 | Dunn et al. |
| 2005/0077624 | A1 | 4/2005 | Tan et al. |
| 2005/0179131 | A1 | 8/2005 | Homma |
| 2006/0017160 | A1 | 1/2006 | Huang |
| 2006/0043603 | A1 | 3/2006 | Ranade et al. |
| 2006/0166402 | A1 | 7/2006 | Lim et al. |
| 2006/0237842 | A1 | 10/2006 | Shindo |
| 2006/0278982 | A1 | 12/2006 | Solo |
| 2007/0023904 | A1 | 2/2007 | Salmon |
| 2007/0080451 | A1 | 4/2007 | Suh |
| 2007/0108606 | A1 | 5/2007 | Watanabe |
| 2007/0284684 | A1 | 12/2007 | Naito et al. |
| 2007/0287279 | A1 | 12/2007 | Daubenspeck et al. |
| 2008/0296764 | A1 | 12/2008 | Chang et al. |
| 2009/0011543 | A1 | 1/2009 | Karta et al. |
| 2009/0026608 | A1 | 1/2009 | Tsai et al. |
| 2009/0045511 | A1 | 2/2009 | Meyer et al. |
| 2009/0096109 | A1 | 4/2009 | Iwasaki |
| 2009/0098724 | A1 | 4/2009 | Yu |
| 2009/0130840 | A1 | 5/2009 | Wang et al. |
| 2009/0197114 | A1 | 8/2009 | Shih et al. |
| 2009/0229857 | A1 | 9/2009 | Fredenberg et al. |
| 2010/0109159 | A1 | 5/2010 | Ho et al. |
| 2010/0230810 | A1 | 9/2010 | Kang et al. |
| 2011/0101523 | A1 | 5/2011 | Hwang et al. |
| 2011/0101526 | A1 | 5/2011 | Hsiao et al. |
| 2011/0156256 | A1 | 6/2011 | Kang et al. |
| 2011/0227216 | A1 | 9/2011 | Tseng et al. |
| 2011/0281432 | A1 | 11/2011 | Farooq et al. |

OTHER PUBLICATIONS

U.S. Appl. No. 61/258,414, filed Nov. 5, 2009, Chien Ling Hwang, et al.
U.S. Appl. No. 61/238,749, filed Sep. 1, 2009, Chung-Shi Liu.
U.S. Appl. No. 61/258,393, filed Nov. 5, 2009, Chien Ling Hwang, et al.
U.S. Appl. No. 61/230,012, filed Jul. 30, 2009, Chung-Shi Liu, et al.
Kim, K. S., et al., "The Interface Formation and Adhesion of Metals (Cu, Ta, and Ti) and Low Dielectric Constant Polymer-Like Organic Thin Films Deposited by Plasma-Enhanced Chemical Vapor Deposition Using Para-Xylene Precursor", Thin Solid Films 377-378 (2000), pp. 122-128.
Kim, K. J., et al., "Chemical Interaction, Adhesion and Diffusion Properties at the Interface of Cu and Plasma-Treated Thiophene-Based Plasma Polymer (ThioPP) Films", Thin Solid Films 398-399 (2001), pp. 657-662.
Du, M., et al., "The Interface Formation of Copper and Low Dielectric Constant Fluoro-Polymer: Plasma Surface Modification and its Effect on Copper Diffusion", Journal of Applied Physics, vol. 85, No. 3, Feb. 1, 1999, pp. 1496-1502.
Jiang, Liang-You, et al., "Reduced Copper Diffusion in Layered Silicate/Fluorinated Polyimide (6FDS-ODA) Nanocomposites", Journal of Applied Polymer Science, vol. 92, 1422-1425 (2004).

SEMICONDUCTOR DEVICE AND SEMICONDUCTOR ASSEMBLY WITH LEAD-FREE SOLDER

PRIORITY CLAIM

The present application is a continuation of U.S. application Ser. No. 12/702,636, filed Feb. 9, 2010, the disclosure of which is incorporated herein by reference in its entirety.

TECHNICAL FIELD

This disclosure relates to lead-free solder, and more particularly, to a semiconductor device and a semiconductor assembly using the lead-free solder.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Wafer level chip scale packaging (WLCSP) is currently widely used for its low cost and relatively simple processes. In a typical WLCSP, interconnect structures are formed on metallization layers, followed by the formation of under-bump metallurgy (UBM), and the mounting of solder balls.

Flip-chip packaging utilizes bumps to establish electrical contact between a chip's I/O pads and the substrate or lead frame of the package. Structurally, a bump actually contains the bump itself and a so-called under bump metallurgy (UBM) located between the bump and an I/O pad. An UBM generally contains an adhesion layer, a barrier layer and a wetting layer, arranged in this order on the I/O pad. The bumps themselves, based on the material used, are classified as solder bumps, gold bumps, copper pillar bumps and bumps with mixed metals. Recently, copper interconnect post technology is proposed. Instead of using solder bump, the electronic component is connected to a substrate by means of copper post. The copper interconnect post technology achieves finer pitch with minimum probability of bump bridging, reduces the capacitance load for the circuits and allows the electronic component to perform at higher frequencies. A solder alloy is still necessary for capping the bump structure and jointing electronic components as well.

Usually, a material used for the solder alloy is so-called Sn—Pb eutectic solder of Sn-38 mass % Pb. In recent years, it is urged to put Pb-free solder to practical use. The binary Sn—Ag alloy is used as the lead-free solder with Ag between 2.0~4.5 weight percent, which melts at a temperature between 240~260° C. The reflow soldering process and equipment for lead-free components are similar to conventional eutectic solder. Many developments of solder alloys have been directed to make the composition of an alloy, as close as possible to the eutectic composition of that in order to use the eutectic point to avoid thermal damage. However, the melting point of a Pb-free solder material is higher than that of the conventional Sn—Pb eutectic solder, so that there arises problems of cracks and stress reliability issues as TCB testing, especially to large die size. Even applied to the Cu post technology, the flip-chip assembly using the Pb-free solder material as the cap still suffers the crack issue induced by die edge/substrate interface stress.

BRIEF DESCRIPTION OF THE DRAWINGS

The aforementioned objects, features and advantages of this disclosure will become apparent by referring to the following detailed description of the preferred embodiments with reference to the accompanying drawings, wherein.

DETAILED DESCRIPTION

This disclosure provides a lead-free solder with controlled Ag content and reflow temperature used in semiconductor devices having Cu post, post passivation interconnects, solder bump, and/or through-silicon vias (TSVs) fabricated thereon, applied to flip-chip assembly, wafer-level chip scale package (WLCSP), three-dimensional integrated circuit (3D-IC) stack, and/or any advanced package technology fields. In the following description, numerous specific details are set forth to provide a thorough understanding of the disclosure. However, one having an ordinary skill in the art will recognize that the disclosure can be practiced without these specific details. In some instances, well-known structures and processes have not been described in detail to avoid unnecessarily obscuring the disclosure. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
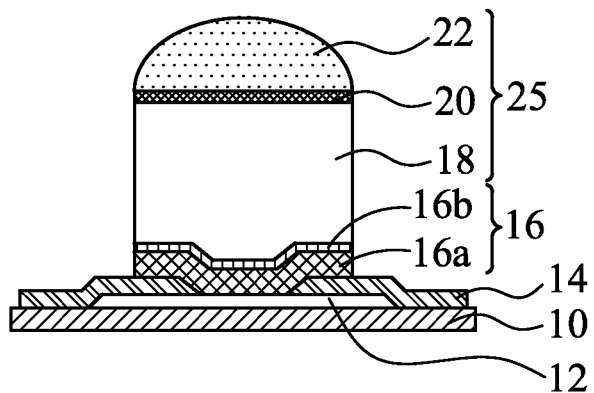
FIG. 1 is a cross-sectional diagram depicting an exemplary embodiment of a semiconductor device with a lead-free solder on a copper post structure.

Herein, cross-sectional diagram of FIG. 1 depicts an exemplary embodiment of a semiconductor device with a lead-free solder on a copper post structure.

An example of a substrate 10 used for Cu post interconnection fabrication may comprise a semiconductor substrate as employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The integrated circuits as used herein refer to electronic circuits having multiple individual circuit elements, such as transistors, diodes, resistors, capacitors, inductors, and other active and passive semiconductor devices. The substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One skilled in the art will realize the formation details of the metallization layers.

A conductive region 12 is a top metallization layer formed in a top-level inter-layer dielectric layer, which is a portion of conductive routs and has an exposed surface treated by a planarization process, such as chemical mechanical polishing (CMP), if necessary. Suitable materials for the conductive region 12 may include, but are not limited to, for example copper, aluminum, copper alloy, or other mobile conductive materials. In one embodiment, the conductive region 12 is a pad region 12, which may be used in the bonding process to connect the integrated circuits in the respective chip to external features.

A passivation layer 14 is formed and patterned on the substrate 10 to partially cover the pad region 12. The passivation layer 14 has an opening 15 exposing a portion of the pad region 12. The passivation layer 14 may be formed of a non-organic material selected from un-doped silicate glass (USG), silicon nitride, silicon oxynitride, silicon oxide, and combinations thereof. Alternatively, the passivation layer 14 may be formed of a polymer layer, such as an epoxy, polyimide, benzocyclobutene (BCB), polybenzoxazole (PBO), and the like, although other relatively soft, often organic, dielectric materials may also be used.

An under-bump-metallurgy (UBM) layer 16 including a diffusion barrier layer 16a and a seed layer 16b is formed on a portion of the passivation layer 14 and electrically connected to the pad region 12 through the opening 15. As depicted, the UBM layer 28 directly contacts the exposed portion of the pad region 12 and lines the sidewalls and bottom of the opening 15. The diffusion barrier layer 16a, also referred to as a glue layer, is formed to cover the sidewalls and the bottom of the opening 15. The diffusion barrier layer 16a may be formed of tantalum nitride, although it may also be formed of other materials such as titanium nitride, tantalum, titanium, or the like. The formation methods include physical vapor deposition (PVD) or sputtering. The seed layer 16b may be a copper seed layer formed on the diffusion barrier layer 16a. The seed layer 16b may be formed of copper alloys that include silver, chromium, nickel, tin, gold, and combinations thereof. In one embodiment, the UBM layer 16 is a Cu/Ti layer.

A copper (Cu) post 18 is formed on the UBM layer 16. As used throughout this disclosure, the term "copper (Cu) post" is intended to include substantially a post including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. For example, electro-chemical plating (ECP) is carried out to form the Cu post with a thickness greater than 40 um. In other embodiments, the thickness of the Cu post is about 40~70 μm, although the thickness may be greater or smaller.

A cap layer 20 is formed on the top surface of the Cu post 18. The cap layer 20 could act as a barrier layer to prevent copper in the Cu post 18 to diffuse into bonding material, such as solder alloy, that is used to bond the substrate 10 to external features. The prevention of copper diffusion increases the reliability and bonding strength of the package. The cap layer 20 may include nickel, tin, tin-lead (SnPb), gold (Au), silver, palladium (Pd), In, nickel-palladium-gold (NiPdAu), nickel-gold (NiAu), other similar materials, or alloy. In one embodiment, the cap layer 20 is a nickel layer with a thickness about 1~5 μm.

Figure 2:
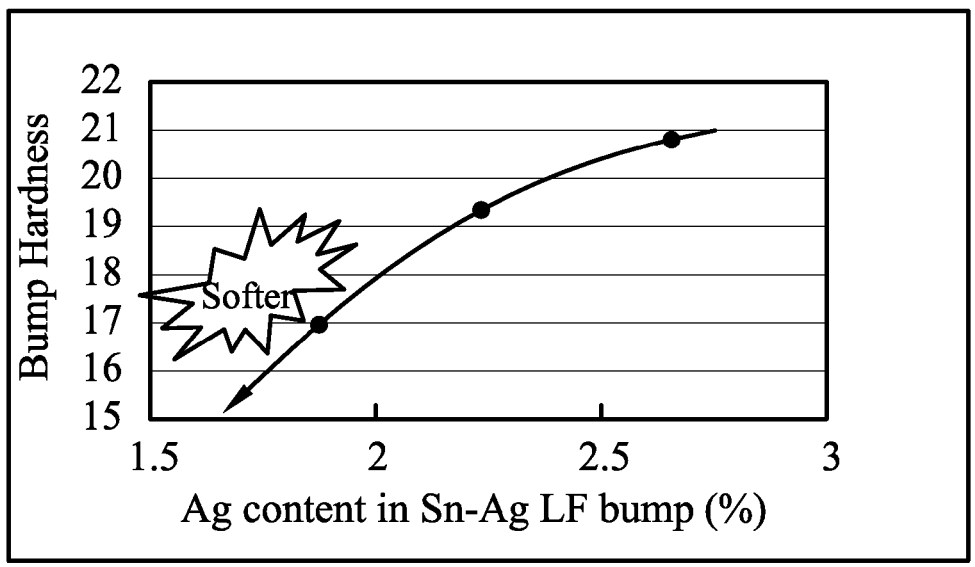
FIG. 2 is a diagram showing the relationship between the Ag content in lead-free solder and bump hardness.

A lead-free (Pb-free) solder layer 22 is formed on the cap layer 20. Thus the lead-free solder layer 22, the cap layer 20, and the Co post 18 are referred to as a bump structure 25 formed over the pad region 12. The lead-free (Pb-free) solder layer 22 may be formed by plating and reflowing processes. In one embodiment, the lead-free solder layer 22 is formed as solder ball on the cap layer 20. In other embodiment, the lead-free solder layer 22 is a plated solder layer on the cap layer 20. For a lead-free solder system, the solder layer 22 is SnAg with Ag content being controlled lower than 1.6 weight percent (wt %). In the reflow process, the melting temperature of the lead-free solder layer 22 is accordingly adjusted to the range of between about 240° C. to about 280° C. In one embodiment, the Ag content in the lead-free solder layer 22 is at the range between about 1.2 wt % to about 1.6 wt %. In other embodiment, the Ag content in the lead-free solder layer 22 is about 1.5 wt %. Reliability of package using lead-free solder alloy relates to several factors, including bump hardness and formation of intermetallic compounds (IMCs) and voids, which may potentially contribute to crack formation and cause thermo-mechanical stresses on the solder joint. It is observed that the bump becomes softer as the Ag content in the lead-free solder is lower as schematically shown in FIG. 2. The softer bump may eliminate the crack issue caused by thermal stress. The SEM study shows that the lead-free solder with lower Ag content provides better performance for crack resistance. On the contrary, as the Ag content in the lead-free solder is higher, the formation of IMCs, voids, and induced cracks will be observed at time zero. However, if the Ag content of the lead-free solder is lower than 1.2 wt %, only a part of the solder bump transfers the state from melting to solid when the temperature is lower than the melting point during the cooling step of reflow process, which makes thermal stress gathering at those bumps to cause cracks. As to the reflowing temperature of the lead-free solder layer 22 in the reflow process, it is adjusted at the range between about 240° C. to about 280° C. to avoid an uncompleted ball-shape formation and suppress the voids and IMCs formation.

Figure 3A:
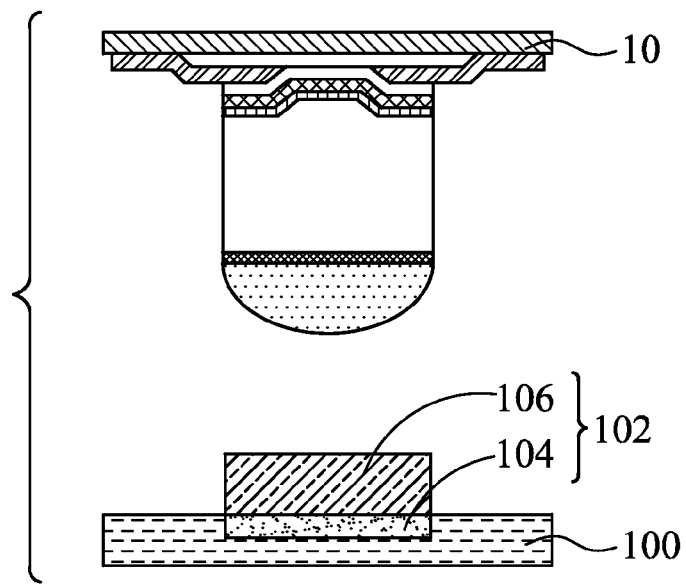
FIG. 3A and FIG. 3B are cross-sectional diagrams depicting an exemplary embodiment of a package assembly with the lead-free solder.
Figure 3B:
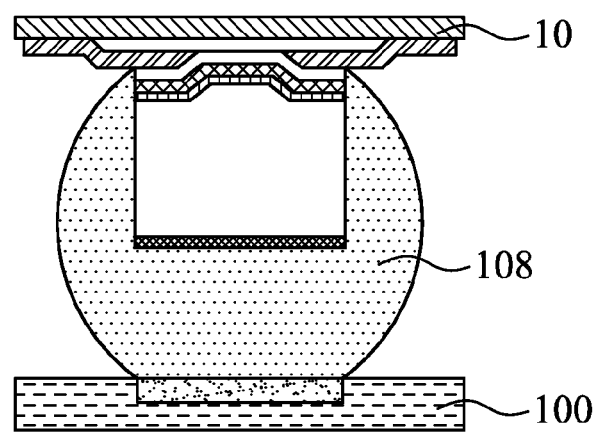

FIG. 3A and FIG. 3B are cross-sectional diagrams depicting an exemplary embodiment of a package assembly with the lead-free solder.

The substrate 10 may then be sawed and packaged onto a package substrate, or another die, with solder balls or Cu posts mounted on a pad on the package substrate or the other die. The structure shown in FIG. 1 is flipped upside down and attached to another substrate 100 at the bottom. The substrate 100 may be a package substrate, board (e.g., a print circuit board (PCB)), or other suitable substrate. The connection structure 102 contacts the substrate 100 at various conductive attachment points, for example, a pre-solder layer 106 on contact pads 104 and/or conductive traces. The pre-solder layer 106 may be a eutectic solder material including alloys of tin, lead, silver, copper, nickel, bismuth, or combinations thereof. Using an exemplary coupling process including a flux application, chip placement, reflowing of melting solder joints, and cleaning of flux residue, a joint-solder structure 108 is formed between the substrates 10 and 100. After the assembly process, the joint-solder layer 108 includes the lead-free solder mixed with the pre-solder, in which the Ag content in the joint-solder layer 108 is lower than 3.0 wt %. The substrate 10, the joint-solder layer 108, and the other substrate 100 may be referred to as a packaging assembly, or in the present embodiment, a flip-chip assembly.

Figure 4:
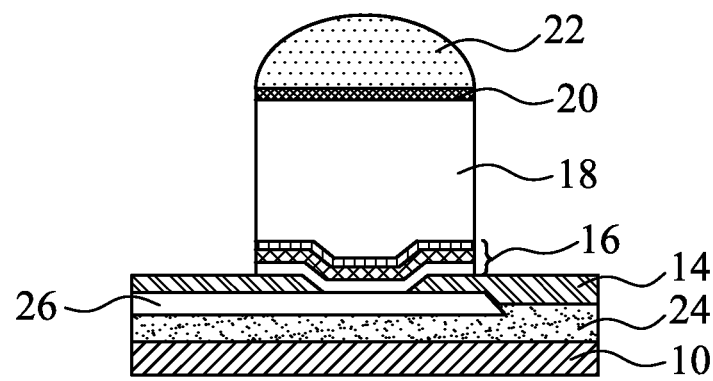
FIG. 4 is a cross-sectional diagram depicting an exemplary embodiment of a Cu post structure on Cu PPI for WLCSP application.

FIG. 4 is a cross-sectional diagram depicting an exemplary embodiment of a Cu post structure on Cu PPI for WLCSP application, while explanation of the same or similar portions to the description in FIG. 1 to FIG. 3 will be omitted. Compared with the Cu post 18 and the UBM layer 16 formed over the pad region 12 as depicted in FIG. 1, the WLCSP process forms a post passivation interconnect (PPI) line 26 underlying the UBM layer 16 and the passivation layer 14 and overlying another passivation layer 24. One end of the PPI line 26 is electrically connected to the pad region 12 (not shown in FIG. 4), and the other end of the PPI line 26 is electrically connected to the UBM layer 16 and the Cu post 18. In one embodiment, one portion of the PPI line 26 is exposed by the passivation layer 14, on which the UBM layer 16 is directly formed. The passivation layer 24 may be formed of a non-organic material selected from un-doped silicate glass (USG), silicon nitride, silicon oxynitride, silicon oxide, and combinations thereof. Alternatively, the passivation layer 24 may be formed of a polymer layer, such as an epoxy, polyimide, benzocyclobutene (BCB), polybenzoxazole (PBO), and the like, although other relatively soft, often organic, dielectric materials may also be used. The PPI line 26 may include, but not limited to, for example copper, aluminum, copper alloy, or other mobile conductive materials. The PPI line 26 may further include a nickel-containing layer (not shown) on the top a copper-containing layer. The PPI formation methods include plating, electroless plating, sputtering, chemical vapor deposition methods, and the like. The PPI line 26 may also function as power lines, re-distribution lines (RDL), inductors, capacitors or any passive components. The PPI line 26 may have a thickness less than about 30 μm, for example between about 2 μm and about 25 μm.

Figure 5:
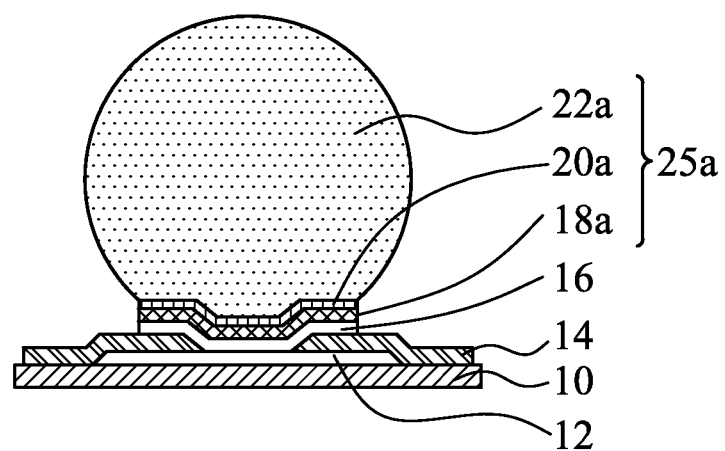
FIG. 5 is a cross-sectional diagram depicting an exemplary embodiment of a solder bump structure.

FIG. 5 is a cross-sectional diagram depicting an exemplary embodiment of a solder bump structure, while explanation of the same or similar portions to the description in FIG. 1 to FIG. 1 will be omitted.

Compared with the structure as depicted in FIG. 1, the formation of the Cu post 18 is replaced by a thin copper (Cu) layer 18a in the solder bump process followed by the formation of the cap layer 20a and the lead-free solder layer 22a. The thin Cu layer 18a has a thickness relatively thinner than the Cu post 18. The thin Cu layer 18a has a thickness less than 10 um. In an embodiment, the thin Cu layer 18a has a thickness about 1~10 um, for example about 4~6 um, although the thickness may be greater or smaller. The thin Cu layer formation methods may include sputtering, printing, electro plating, electroless plating, and commonly used chemical vapor deposition (CVD) methods. The lead-free (Pb-free) solder layer 22a is reflowed as a solder ball. Therefore, the lead-free solder layer 22a, the cap layer 20a and the copper layer 18a are referred to as a solder bump structure 25a. The solder layer 22a is SnAg with Ag content being controlled lower than 1.6 weight percent (wt %), which is melted at the range of between about 240° C. to about 280° C. In one embodiment, the Ag content in the lead-free solder layer 22a is at the range between about 1.2 wt % to about 1.6 wt %. In other embodiment, the Ag content in the lead-free solder layer 22a is about 1.5 wt %.

Figure 6:
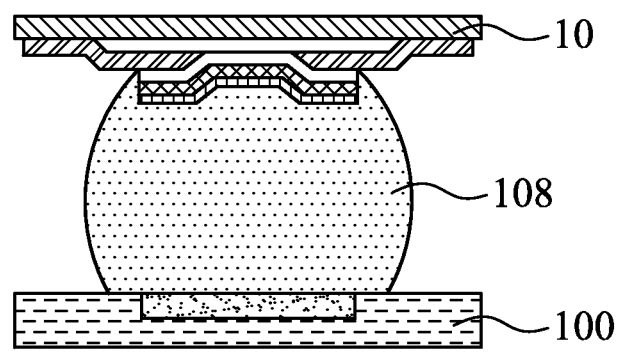
FIG. 6 is a cross-sectional diagram depicting an exemplary embodiment of a package assembly with the solder bump structure.

FIG. 6 is a cross-sectional diagram depicting an exemplary embodiment of a package assembly with the semiconductor device shown in FIG. 5, while explanation of the same or similar portions to the description in FIG. 1 to FIG. 3 will be omitted. After the assembly process, the substrate 10, the joint-solder layer 108, and the other substrate 100 may be referred to as a packaging assembly, or in the present embodiment, a flip-chip assembly. The joint-solder layer 108 includes the lead-free solder mixed with the pre-solder, in which the Ag content in the joint-solder layer 108 is lower than 3.0 wt %.

Figure 7:
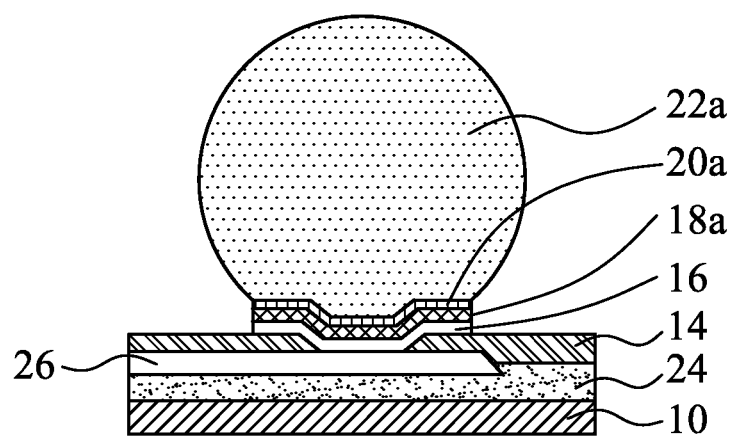
FIG. 7 is a cross-sectional diagram depicting an exemplary embodiment of a solder bump structure on Cu PPI for WLCSP application.

FIG. 7 is a cross-sectional diagram depicting an exemplary embodiment of a solder bump structure on Cu PPI for WLCSP application, while explanation of the same or similar portions to the description in FIG. 1 to FIG. 6 will be omitted. Compared with the solder bump structure as depicted in FIG. 5, the WLCSP process forms a post passivation interconnect (PPI) line 26 underlying the UBM layer 16 and the passivation layer 14 and overlying another passivation layer 24. One end of the PPI line 26 is electrically connected to the pad region 12 (not shown in FIG. 7), and the other end of the PPI line 26 is electrically connected to the UBM layer 16. In one embodiment, one portion of the PPI line 26 is exposed by the passivation layer 14, on which the UBM layer 16 is directly formed.

Figure 8A:
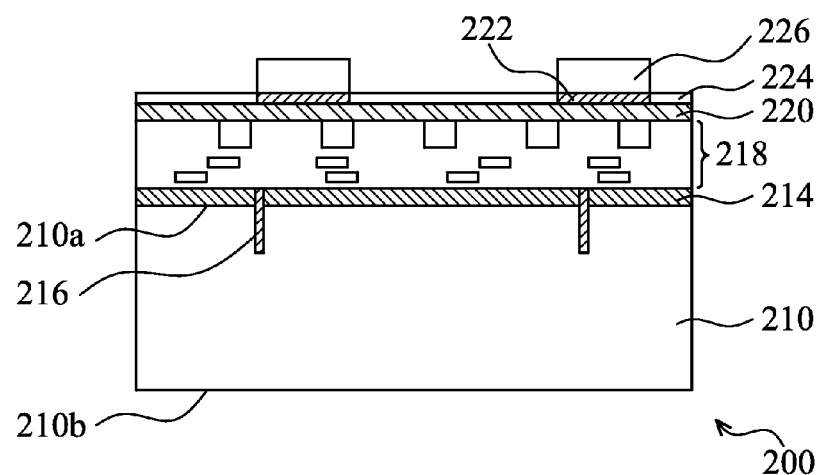
FIG. 8A to FIG. 8C are cross-sectional diagrams depicting an exemplary embodiment of manufacturing vertically stacked devices using the lead-free solder.
Figure 8B:
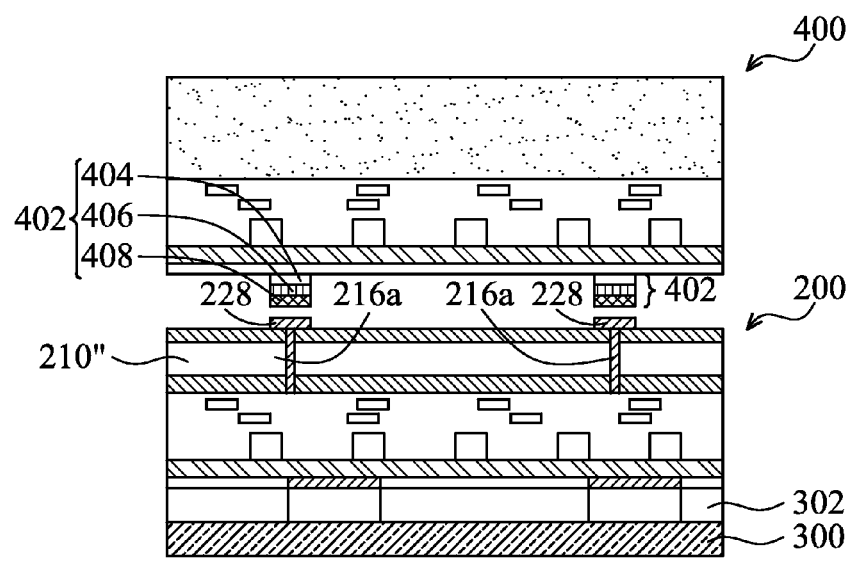
Figure 8C:
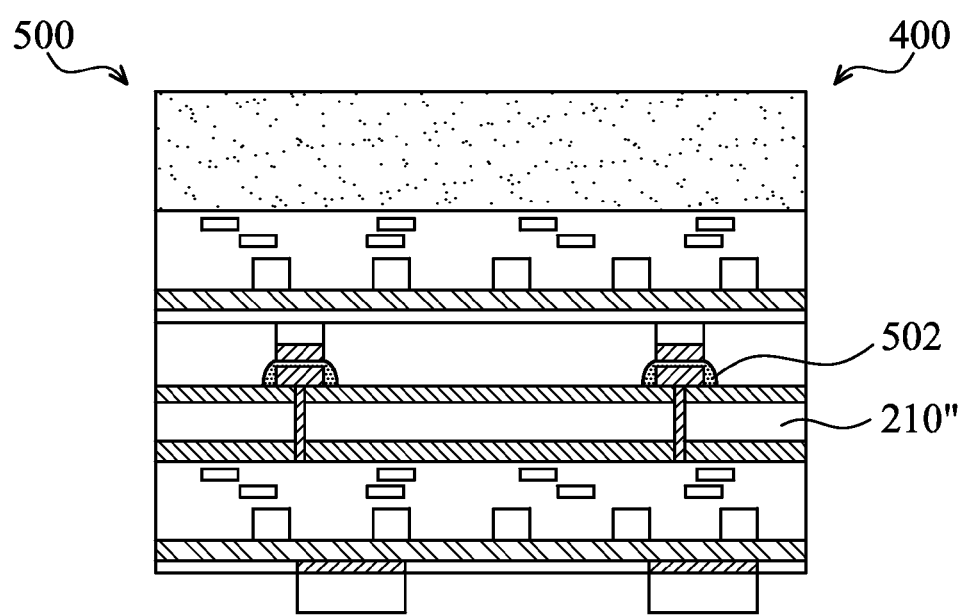

FIG. 8A to FIG. 8C are cross-sectional diagrams depicting an exemplary embodiment of manufacturing vertically stacked devices using the lead-free solder. Three-dimensional (3D) wafer-to-wafer, die-to-wafer or die-to-die vertical stack technology seeks to achieve the long-awaited goal of vertically stacking many layers of active IC devices such as processors, programmable devices and memory devices to shorten average wire lengths, thereby reducing interconnect RC delay and increasing system performance. One major challenge of 3D interconnects on a single wafer or in a die-to-wafer vertical stack is through-silicon via (TSV) that provides a signal path for high impedance signals to traverse from one side of the wafer to the other. Through-silicon via (TSV) is typically fabricated to provide the through-silicon via filled with a conducting material that passes completely through the layer to contact and connect with the other TSVs and conductors of the bonded layers.

Referring to FIG. 8A, a wafer 200, which includes a substrate 210, is provided. An example of a substrate 210 may include a semiconductor substrate as employed in a semiconductor integrated circuit fabrication, and integrated circuits may be formed therein and/or thereupon. The substrate 210 has a first surface 210a and a second surface 210b opposite to the first surface 210a. The first surface 210a may be referred to as the frontside on which integrated circuits including active and passive devices such as transistors, resistors, capacitors, diodes, inductors and the like, are formed to connect bond pads and/or other interconnection structures. The circuitry may be any type of circuitry suitable for a particular application. The functions may include memory structures, processing structures, sensors, amplifiers, power distribution, input/output circuitry, or the like. The second surface 210b may be referred to as the backside, which will be thinned down and processed to form bond pads and/or other interconnection structures thereon.

A first dielectric layer 214 is formed on the first surface 10a, in which contacts are formed to electrically connect the devices respectively. Generally, the first dielectric layer 214 may be formed, for example, of a low-K dielectric material, silicon oxide, phosphosilicate glass (PSG), borophosphosilicate glass (BPSG), fluorinated silicate glass (FSG), or the like, by any suitable method known in the art. Other materials and processes may be used.

A plurality of through vias 216 passes through at least a part of the substrate 210. The through via 216 is a conductor-filled plug extending from the first surface 210a toward the second surface 10b and reaching an intended depth. Also, an isolation layer is formed on the sidewalls and bottom of the though via 216, and insulates the though via 216 from the substrate 210. The through vias 16 may be formed of any suitable conductive material, but are preferably formed of a highly-conductive, low-resistive metal, elemental metal, transition metal, or the like. In an embodiment, the though via 216 is a trench filled with a conductive layer formed of Cu, W, Cu alloy, or the like. A conductive barrier layer formed of Ti, TiN, Ta, TaN or combinations thereof may be formed in the trench surrounding the conductive layer. The isolation layer may be formed of commonly used dielectric materials such as silicon nitride, silicon oxide (for example, tetra-ethyl-orthosilicate (TEOS) oxide), and the like.

A first interconnect structure 218, which includes inter-layer dielectric layers and a metallization structure are formed overlying the integrated circuits, the first dielectric layer 214 and the through vias 216. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. The metallization structure includes metal lines and vias, which may be formed of copper or copper alloys, and may be formed using the well-known damascene processes. One skilled in the art will realize the formation details of the metallization layers.

A passivation layer 220 is formed over first interconnect structure 218. The passivation layer 220 may be formed of materials such as silicon oxide, silicon nitride, un-doped silicate glass (USG), polyimide, and/or multi-layers thereof. A metal pad 222 is formed on the passivation layer 220. The metal pad 222 may be formed of aluminum, copper, silver, gold, nickel, tungsten, alloys thereof, and/or multi-layers thereof. The metal pad may be electrically connected to the devices and the through via 216, for example, through underlying first interconnection structure 218. A dielectric buffer layer 224 is formed on the metal pad and patterned to provide a bump formation window. The dielectric buffer layer 224 may be formed of a polymer, such as an epoxy, polyimide, benzocyclobutene (BCB), polybenzoxazole (PBO), and the like, although other relatively soft, often organic, dielectric materials can also be used. A bump structure 226 is then formed overlying and electrically connected to the metal pad 222. The bump structure 224 refers to the structures 25 and 25a shown in FIGS. 1, 4,5 and 7. The details are thus not repeated herein.

Referring to FIG. 8B, the wafer 200 is attached to a carrier 300 through an adhesive layer 302 and then the bonded structure is flipped. Since the bonded structure is flipped, a thinning process e.g., grinding and/or etching is then performed on the second surface 210b to remove the most portion of the substrate 210 to the desired final thickness, resulting in a thinned substrate 210" with a predetermined thickness depending on the purpose for which the semiconductor package is used. One of ordinary skill in the art will realize that other thinning processes, such as a polish process (including a wet polish (CMP) and a dry polish), a plasma etch process, a wet etch process, or the like, may also be used. In an embodiment, the end 216a of the through via 216 is exposed and/or protruded from the second surface 210b" of the thinned substrate 210" after the thinning process. Then, processing of the second surface 210b" of the thinned substrate 210" is performed to form a second interconnect structure 228 electrically connected to the through via 216. For an example, the second interconnect structure 228 includes electrical connections and/or other structures (e.g., redistribution layers, pads, solder bumps or copper bumps) are formed over the surface 210b" of the thinned wafer 210". The details of the backside grinding and the interconnect structure formation is provided in the co-pending U.S. patent applications: application Ser. No. 12/332,934, entitled "Backside Connection to TSVs Having Redistribution Lines;" and application Ser. No. 12/347,742, entitled "Bond Pad Connection to Redistribution Lines Having Tapered Profiles;" which applications are hereby incorporated herein by reference. The details are thus not repeated herein.

Next, dies 400 are provided for being bonded onto the thinned wafer 210". The dies 400 may be memory chips, RF (radio frequency) chips, logic chips, or other chips. Each die 400 includes a bump structure 402 used for electrically connected to the second interconnect structure 228 of the thinned wafer 210". The bump structure 402 includes a copper layer 404, an optional cap layer 406 on the top of the copper layer 404, and a lead-free solder layer 408 over the copper layer 404. The copper layer 404 may be a thin copper layer of about 0.5~10 um thickness or a thick copper layer of about 40~70 μm thickness. The optional cap layer 406 may include nickel, gold (Au), silver, palladium (Pd), indium (In), nickel-palladium-gold (NiPdAu), nickel-gold (NiAu) or other similar materials or alloy. The lead-free solder layer 408 may be a plated layer or reflowed as a solder ball. The solder layer 408 is SnAg with Ag content being controlled lower than 1.6 weight percent (wt %). In the reflow process, the melting temperature of the lead-free solder layer 408 is accordingly adjusted to the range of between about 240° C. to about 280° C. In one embodiment, the Ag content in the lead-free solder layer 408 is at the range between about 1.2 wt % to about 1.6 wt %. In other embodiment, the Ag content in the lead-free solder layer 408 is about 1.5 wt %.

Referring to FIG. 8C, the dies 400 are bonded onto the thinned wafer 210" through the bump structures 402 and the second interconnect structure 228, forming a dies-to-wafer stack 500. Using an exemplary coupling process including a flux application, chip placement, reflowing of melting solder joints, and cleaning of flux residue, joint structures 502 are formed between the wafer 210" and the dies 400. The joint structure 502 includes the bump structure 402, the second interconnect structure 228, and the lead-free solder layer 408 joined therebetween. Thereafter, the carrier 300 is detached from the thinned wafer 210", and then dies-to-wafer stack 500 is sawed in the usual manner along cutting lines to separate the dies-to-wafer stack into individual IC stacks, and then packaged on to a package substrate with solder bumps or Cu bumps mounted on a pad on the package substrate. In some embodiments, the package substrate is replaced by another die.

In some embodiments, a semiconductor device comprises a semiconductor substrate, a pad region on the semiconductor substrate, a passivation layer over the semiconductor substrate and at least a portion of the pad region, and a bump structure overlying the pad region. The passivation layer has an opening defined therein to expose at least another portion of the pad region. The bump structure is electrically connected to the pad region via the opening. The bump structure comprises a copper layer and a SnAg layer overlying the copper layer. The SnAg layer has a melting temperature higher than the eutectic temperature of Sn and Ag.

In some embodiments, a semiconductor assembly comprises a first substrate, a pad region over the first substrate, a passivation layer over the first substrate and at least a portion of the pad region, a second substrate, and a joint structure disposed between the first substrate and the second substrate. The passivation layer has an opening defined therein to expose at least another portion of the pad region. The joint structure is electrically connected to the pad region via the opening. The joint structure comprises a bump structure and a solder layer. The bump structure is between the pad region of the first substrate and the second substrate. The solder layer is between the bump structure and the second substrate. The solder layer comprises silver (Ag), and has a melting temperature between 240° C. and 280° C.

In a method of forming a semiconductor device in accordance with some embodiments, a pad region is formed over a semiconductor substrate. A passivation layer is formed over the semiconductor substrate and at least a portion of the pad region, the passivation layer having an opening defined therein to expose at least another portion of the pad region. A copper post is formed over the pad region, the copper post electrically connected to the pad region via the opening. A lead-free solder layer is formed over the copper post. The lead-free solder layer comprises silver (Ag) and the lead-free solder layer has a melting temperature between 240° C. and 280° C. The lead-free solder layer is re-flown.

In the preceding detailed description, the disclosure is described with reference to specifically exemplary embodiments thereof. It will, however, be evident that various modifications, structures, processes, and changes may be made thereto without departing from the broader spirit and scope of the disclosure, as set forth in the claims. The specification and drawings are, accordingly, to be regarded as illustrative and not restrictive. It is understood that the disclosure is capable of using various other combinations and environments and is capable of changes or modifications within the scope of the inventive concept as expressed herein.

What is claimed is:

1. A semiconductor device, comprising:
   a semiconductor substrate;
   a pad region on the semiconductor substrate;
   a passivation layer over the semiconductor substrate and at least a portion of the pad region, the passivation layer having an opening defined therein to expose at least another portion of the pad region; and
   a bump structure overlying the pad region and electrically connected to the pad region via the opening;
   wherein the bump structure comprises a copper layer and a SnAg layer overlying the copper layer, and the SnAg layer has a melting temperature higher than the eutectic temperature of Sn and Ag and;
   an interconnect line between the bump structure and the pad region.

2. The semiconductor device of claim 1, wherein the Ag content in the SnAg layer is greater than 1.2 weight percent.

3. The semiconductor device of claim 1, wherein the Ag content in the SnAg layer is less than 1.6 weight percent.

4. The semiconductor device of claim 1, wherein the copper layer is a copper post with a thickness greater than 40 um.

5. The semiconductor device of claim 1, wherein the copper layer has a thickness less than 10 um.

6. The semiconductor device of claim 1, further comprising a nickel layer between the copper layer and the SnAg layer.

7. The semiconductor device of claim 1, further comprising an under-bump metallization (UBM) layer between the bump structure and the pad region.

8. The semiconductor device of claim 1, further comprising a through via extending from a first surface of the semiconductor substrate through the semiconductor substrate to a second surface of the semiconductor substrate and electrically connected to the pad region.

9. The semiconductor device of claim 8, wherein the through via comprises copper.

10. A semiconductor assembly, comprising:
    a first substrate;
    a pad region over the first substrate;
    a passivation layer over the first substrate and at least a portion of the pad region, the passivation layer having an opening defined therein to expose at least another portion of the pad region;
    a second substrate; and
    a joint structure disposed between the first substrate and the second substrate and electrically connected to the pad region via the opening;
    wherein the joint structure comprises:
       a bump structure between the pad region of the first substrate and the second substrate, and
       a solder layer between the bump structure and the second substrate; and
    wherein the solder layer comprises silver (Ag), and has a melting temperature between 240° C. and 280° C.

11. The semiconductor assembly of claim 10, wherein the bump structure comprises a copper post with a thickness greater than 40 um.

12. The semiconductor assembly of claim 11, wherein the bump structure comprises a nickel-containing layer on the copper post.

13. The semiconductor assembly of claim 10, wherein the bump structure comprises has a copper layer with a thickness less than 10 um.

14. The semiconductor assembly of claim 13, wherein the bump structure comprises a nickel-containing layer on the copper layer.

15. The semiconductor assembly of claim 10, wherein at least one of the first substrate or the second substrate is a semiconductor substrate comprising a through via passing through the semiconductor substrate and electrically connected to the bump structure.

16. The semiconductor assembly of claim 10, wherein each of the first substrate and the second substrate is a semiconductor substrate.

17. A method of forming a semiconductor device, comprising:
    forming a pad region over a semiconductor substrate;
    forming a passivation layer over the semiconductor substrate and at least a portion of the pad region, the passivation layer having an opening defined therein to expose at least another portion of the pad region;
    forming a copper post over the pad region, the copper post electrically connected to the pad region via the opening;
    forming a lead-free solder layer over the copper post, wherein the lead-free solder layer comprises silver (Ag) and the lead-free solder layer has a melting temperature between 240° C. and 280° C.; and
    reflowing the lead-free solder layer.

18. The method of claim 17, wherein the reflowing the lead-free solder layer is at the temperature between 240° C. to 280° C.

19. The method of claim 17, wherein the Ag content in the lead-free solder layer is greater than 1.2 weight percent and less than 1.6 weight percent.

* * * * *